United States Patent [19]

Forget et al.

[11] 4,264,409
[45] Apr. 28, 1981

[54] CONTAMINATION-FREE SELECTIVE REACTIVE ION ETCHING OR POLYCRYSTALLINE SILICON AGAINST SILICON DIOXIDE

[75] Inventors: Lawrence E. Forget, Poughkeepsie; Robert A. Gdula, Campbell Hall; Joseph C. Hollis, Poughquag, all of N.Y.

[73] Assignee: International Business Machines Corporation, Armonk, N.Y.

[21] Appl. No.: 130,916

[22] Filed: Mar. 17, 1980

[51] Int. Cl.³ .................................. H01L 21/306
[52] U.S. Cl. .................................. 156/643; 156/646; 156/657; 156/662; 204/192 E; 252/79.1
[58] Field of Search .................. 252/79.1, 79.3; 156/643, 646, 653, 657, 659.1, 662, 667; 204/164, 192 E, 298; 250/531

[56] References Cited

U.S. PATENT DOCUMENTS 4,211,601  7/1980  Mogab .......................... 156/646 X
4,213,818  7/1980  Lemons et al. .................. 156/643

*Primary Examiner*—William A. Powell
*Attorney, Agent, or Firm*—George O. Saile

[57] ABSTRACT

Disclosed is an improved Reactive Ion Etching (RIE) technique for etching polycrystalline silicon or single crystal silicon as must be done in Very Large Scale Integration (VLSI) using silicon technology. It teaches the use of an etch gas that consists of a mixture of silicon tetrafluoride (SiF₄) and chlorine (Cl₂) diluted with inert gas. This etch gas allows an RIE process which combines the very desirable features of selectivity (high Si/SiO₂ etch rate ratio), directionality which creates vertical sidewalls on the etched features and contains no contaminants which can cause yield problems in VLSI circuits. Vertical side walls means no mask undercutting, hence zero etch bias.

8 Claims, 4 Drawing Figures

CONTAMINATION-FREE SELECTIVE REACTIVE ION ETCHING OR POLYCRYSTALLINE SILICON AGAINST SILICON DIOXIDE

DESCRIPTION

Technical Field

The invention relates to methods for reactive ion etching and more particularly to methods for obtaining contamination-free, selective reactive ion etching of polycrystalline silicon.

Background Art

The important step in the manufacture of semiconductor chips and integrated circuits is the etching of the different layers such as polycrystalline silicon and single crystal silicon which make up the finished semiconductor circuit. In the manufacture of semiconductor circuits, one method of etching has been to overlay the surface to be etched with a suitable mask and immerse the masked circuit in a chemical solution which attacks the surface to be etched while leaving the mask intact. It has been difficult with the chemical etching processes presently known to achieve well defined edges on the etched surfaces. The difficulty arises because the chemicals used for etching tend to undercut the mask, i.e., the chemical seeps under the mask and continues to attack the surface to be etched under the periphery of the mask area. A related difficulty which is encountered with certain materials is that the chemical action tends to eat through the surface to be etched and attacks the substrate beneath. It is, therefore, very difficult to use wet chemical etching to achieve fine structures. Fine structures being defined as structures having geometries on the order of one micron or less.

In the manufacture of semiconductor integrated circuits, another procedure (sometimes called plasma etching) is used in which a container such as a bell jar is filled with a gas such as $CF_4$, $SF_6$, or $Cl_2$ whose constituent ions are chemically reactive. A surface to be etched is covered by a mask and inserted into the container along with the reactive gas. To etch the surface, an RF exciting coil around the container is activated to excite the $CF_4$, $SF_6$, or $Cl_2$ thereby disassociating the $CF_4$, $SF_6$, or $Cl_2$ and forming various positive and negative ions. The disassociated ions apparently then chemically interact with the surface to be etched producing various gases as a reaction product. As with the wet chemical etching process described above, this type of plasma etching can also result in undercutting of the mask areas so that it is difficult to achieve well defined edges.

Reactive ion etching or plasma ion etching is well known in the prior art. The U.S. Pat. No. 3,573,192, entitled "Plasma Generating Apparatus", granted Mar. 30, 1971 to R. L. Bersin et al describes a plasma, or ionized gas, generating apparatus for reaction of the plasma with nongaseous substances in a container. U.S. Pat. No. 3,880,684, entitled "Process for Preparing Semiconductor", granted Apr. 29, 1975 to H. Abe describes a semiconductor prepared by continuously etching at least two types of silicon compound layers, such as silicon dioxide ($SiO_2$), silicon nitride ($Si_3N_4$) or polycrystalline silicon which are formed on a silicon substrate. A freon gas plasma is used by Abe for etching so that the two types of silicon compound layers are continuously etched in a sloped form with undercutting, as occurs in conventional chemical solution etching. U.S. Pat. No. 3,923,568 entitled "Dry Plasma Process for Etching Noble Metal" granted Dec. 2, 1975 to R. L. Bersin discloses a process for etching noble metals, particularly for removing selected areas of thin films of electrically conductive noble metals, by contacting exposed areas of noble metal with a plasma that must include both fluorine and chlorine and may, optionally also contain oxygen. U.S. Pat. No. 3,971,684, entitled "Etching Thin Film Circuits and Semiconductor Chips", granted July 27, 1976 to S. Y. Muto discloses a method of etching either thin film circuits or semiconductor chips which is capable of producing extremely well-defined edges on etched materials, while at the same time achieving rapid etching rates. U.S. Pat. No. 3,994,793 entitled "Reactive Ion Etching of Aluminum", granted Nov. 30, 1976 to J. M. Harvilchuck et al teaches a process for reactive ion etching of aluminum wherein a masked layer of aluminum supported on a substrate is exposed to an RF plasma formed by imposing an RF voltage across at least two spaced electrodes in a gaseous environment composed of an inert gas and a gas selected from the group consisting of $CCl_4$, $Cl_2$, $Br_2$, and HCl. U.S. Pat. No. 4,069,096 entitled "Silicon Etching Process" granted Jan. 17, 1978 to A. R. Reinberg et al discloses a process for etching silicon including the step of contacting said silicon with a plasma derived from a gas comprising $CCl_4$, an inert gas and a gas selected from the group consisting of $Cl_2$ and HCl. U.S. Pat. No. 4,094,732, entitled "Silicon Etching Process" granted June 13, 1978 to A. R. Reinberg teaches a process for etching silicon including the step of contacting the silicon with a plasma derived from a gas comprising $CCl_3$ and an inert gas. The inert gas is nitrogen or argon.

It is desirable to be able to reactive ion etch polycrystalline silicon or monocrystalline silicon selectively with an etch rate of silicon to silicon dioxide ratio of greater than ten. Further, the directional etching characteristic is needed so as to form fine geometries in VLSI. Still further, it is needed to have complete chemical contamination-free ambients when making VLSI structures to prevent possible contamination of the VLSI devices from side reactions, redpositions or absorption of some foreign element from the gas phase. None of the commonly used reactive ion etch gases fulfill all of the needs for VLSI processing. Carbontetrafluoride ($CF_4$) is neither selective nor directional and always leaves some carbon contamination. Chlorine ($Cl_2$) is sometimes directional, but is not very selective. Sulfur hexafluoride ($SF_6$) can be both selective and directional as described in L. E. Forget et al patent application Ser. No. 013696 filed Feb. 21, 1979, now patent No. 4,214,946 but does leave some sulfur contamination.

SUMMARY OF PRESENT INVENTION

Silicon tetrafluoride ($SiF_4$) is a gas that can be broken down in a reactive ion etch plasma to yield reactive fluorine atoms which will etch polycrystalline silicon and monocrystalline silicon and is uncontaminating. However, etching is very slow in silicon tetrafluoride, never directional and leaves brown deposits of elemental silicon on the inside surfaces of the reactor. It has been unexpectedly discovered that additions of chlorine ($Cl_2$) and inert dilutent gas produces reactive ion etching of silicon that is selective, absolutely directional, does not redeposit silicon on the insides of the reactor, and no possibility of contamination of the silicon by undesired elements introduced in the etching gas.

DISCLOSURE OF INVENTION

A method of etching is described which is useful in the manufacture of semiconductor integrated circuits. The process is capable of producing the well-defined edges on etched materials while at the same time providing preferential etching of polycrystalline silicon or monocrystalline silicon over silicon dioxide. Also, the etching process is free of contaminants to silicon VLSI. According to the method a gas comprised of $Cl_2$, $SiF_4$, and inert gas such as helium or argon is placed in a container along with a cathode electrode and an anode electrode. A surface to be etched is covered by a suitable mask and mounted on one of the electrodes, for example, the cathode which is negative biased relative to the remaining electrodes, for example, by applying an RF biasing signal. An electric field is thus established in the region between the cathode and the anode, and serves to disassociate the reactive gas to form a plasma. Chemically reactive gas species are attracted to the cathode and thereby impinge on the sample to be etched. Apparently, the surface is etched by both chemical interaction with various active species and by the momentum transfer of positive ions impinging on the surface. By virtue of the electric field attracting ions to the cathode, the ions impinging on the surface to be etched arrive predominantly in a direction perpendicular to that surface so that the process produces well defined, substantially vertically etched sidewalls. Still further, the use of the gas mixture of $Cl_2$ and $SiF_4$ in an inert gas allows polycrystalline silicon to be selectively etched against silicon dioxide or silicon nitride with a high etch rate ratio and substantially vertical sidewalls.

Very Large Scale Integrated (VLSI) devices in silicon technology often require etching of silicon into fine (submicron) patterns and lines. To accomplish this, two attributes of the process are necessary: directionality (anisotropy or vertical etching) because it can be shown that, for isotropic etching (wet chemical), the minimum line width that can be etched is two times the etched depth; and selectivity that is etching monocrystalline silicon or polycrystalline silicon without eroding the mask and being able to stop at a very thin $SiO_2$ insulating layer beneath the silicon. With these two attributes, etch bias can be held to zero without disturbing the vertical structure. A third necessary attribute is contamination-free characteristic of the gas constituents upon the silicon VLSI structure. Yield problems occur particularly with the submicron geometries of VLSI where contamination is present.

Figures 1A, 1B:
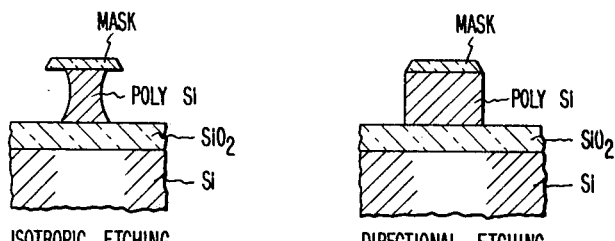
FIG. 1A shows a cross-sectional view of a polycrystalline silicon line exhibiting isotropic etching as is produced with a wet chemical etching or certain plasma etching processes.
FIG. 1B shows a cross-sectional view of a polycrystalline silicon line exhibiting directional etching as achieved by the process of the present invention.

Conventional plasma etching, such as $CF_4$ or $CF_4+O_2$, can provide selectivity but the etching is isotropic, that is with a mask undercut as seen in FIG. 1A. RIE with chlorinated etch gases, such as $Cl_2$, can provide directionality but does not have good selectivity and is very non-uniform when etching polycrystalline silicon. RIE with $SF_6$ is known (Muto U.S. Pat. No. 3,971,684, supra) to etch silicon and can provide either high selectivity (with isotropic etching) or directionality (with low selectivity). It has not been possible to obtain both directionality and high selectivity simultaneously. The further problem with $CF_4$ and $SF_6$ is that they leave carbon and sulfur contaminants, respectively, as a necessary result of their etching process.

Silicon tetrafluoride ($SiF_4$) is known as a source of fluorine ions in a R.F. plasma and is contamination free with silicon bodies. However, it has never been successfully practiced in reactive ion etching because of its characteristics of slow etching, non-directional etching and it leaves deposits of elemental silicon on the inside surfaces of the reactor. The present method makes use of the unexpected result that substitutions of $Cl_2$ for part of the $SiF_4$ in combination with an inert gas, such as helium or argon, produce an RIE behavior that is selective for silicon, directional as shown in FIG. 1B, and free of contamination to silicon VLSI. The reactive gas mixture consists essentially of X parts $SiF_4$, Y parts $Cl_2$, and Z parts of inert gas which total is essentially one hundred parts. The reactive components X+Y is less than about 25 parts and more than about 2 parts. The components X and Y are respectively more than zero. The operative range of the $SiF_4$ component is between about 1.5 parts and 20 parts, while $Cl_2$ is between about 0.5 parts and 20 parts. When $SiF_4$ goes above about 20 parts, the reactive etching becomes non-directional and deposits form on the reactor walls. When $Cl_2$ is above about 20 parts, the etch rate ratios are reduced.

Figure 2A:
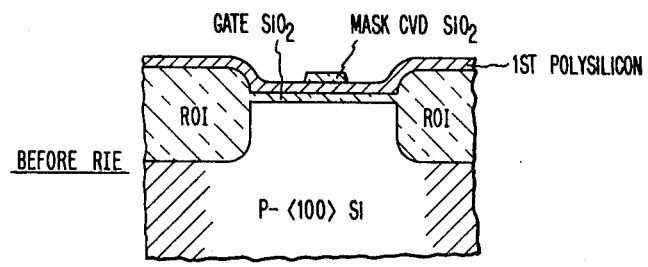
FIG. 2A shows a cross-sectional schematic view of the step in the manufacture of a field effect transistor just prior to the dilineation of the first polycrystalline silicon level.
Figure 2B:
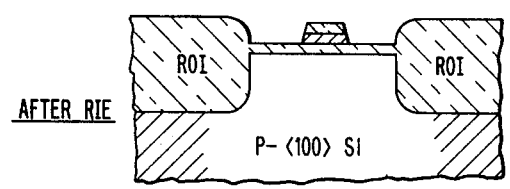
FIG. 2B shows the result of reactive ion etching as taught by the present invention of the FIG. 2A structure for defining the gate electrode in the first polycrystalline silicon level.

Referring now more particularly to FIGS. 2A and 2B, a schematically illustrated, minute part of a highly dense field effect transistor integrated circuit is shown. A recessed silicon dioxide isolated (ROI) region of P−<100> oriented monocrystalline silicon is isolated thereby from other such regions. The ROI dielectric isolation may be formed by any one of many well known isolation techniques. The gate $SiO_2$ layer may be formed by the conventional thermal oxidation process which involves subjecting the bare silicon body to a wet oxygen ambient at a temperature of 970° C. for a suitable amount of time or by a conventional chemical vapor deposition (CVD) technique. A first polycrystalline silicon or polysilicon layer is then deposited over the entire wafer by using, for example, a mixture of silane and a gaseous dopant source of either P or N type in a hydrogen ambient in a temperature range of from 500° to 1000° C. Alternately, the polycrystalline silicon can be deposited and then doped by an ion implantation process. The mask CVD $SiO_2$ is formed by depositing the silicon dioxide using silane, $SiH_4$ and oxygen at about 450° C. or silicon hydrogen chloride, $SiH_2Cl_2$ and $N_2O$ at a temperature of about 800° C. under atmospheric or low pressure conditions. The mask illustrated in FIG. 2A is then formed by conventional lithography and etching techniques. The mask CVD silicon dioxide is formed to cover the planned location for gate electrode structures. The FIG. 2A structure is positioned into a reactive ion etching apparatus as described above.

The gaseous mixture of $SiF_4$, $Cl_2$ and an inert gas is flowed into the reactor and the plasma formed by suitable application of RF power across the electrodes. Reactive ion etching proceeds until all of the unmasked first polysilicon layer is removed as shown in FIG. 2B. Subsequent steps can be utilized to form the source-/drain regions (not shown) adjacent to the gate structure formed by the process of FIGS. 2A and 2B.

The monocrystalline silicon substrates can also be etched using the $SiF_4$, $Cl_2$ and inert gas process as described above. In this case, masks of silicon dioxide, silicon nitride or similar material which will remain substantially unaffected by $SiF_4$ and $Cl_2$ plasma acting as masks. The structure is then reactive ion etched in a suitable apparatus to the desired depth of the silicon body. It is obvious that this process could be used to form, for example, a dielectric isolation like the ROI structure shown in FIGS. 2A and 2B.

The following examples are included merely to aid in the understanding of the invention and variations may be made by one skilled in the art without departing from the spirit and scope of the invention.

EXAMPLES 1 AND 2

The reactor employed was a conventional diode RIE tool such as described in P. M. Schaible et al. "Reactive Ion Etching of Aluminum and Aluminum Alloys in an RF Plasma Containing Halogen Species", *J. Vac. Sci Technol*, 15(2) 334–7 (1978), except that it was driven at 40 MHz. It was employed in an identical manner.

In these experiments 10% $SiF_4$ 90% He was used as the etch gas to RIE N+ doped polysilicon as might be used for the gate metal of a submicron FET and P−>100> single crystal silicon as would be used as the substrate for a submicron FET device.

The conditions given in Table I were selected, based upon past experience with other RIE gases to give: reasonable silicon etch rates; high selectivity; and directional etching.

The resulting products were unuseable because the etching was isotropic (undercut the mask) in both cases, as shown in FIG. 1A. Additionally, the reactor's internal surface became coated with a brown deposit of elemental silicon.

EXAMPLES 3 AND 4

The procedure of the Examples 1 and 2 was followed with the exceptions that the etchant gas was a blend of 10% $SiF_4$ in He and 12% $Cl_2$ in Ar in roughly equal proportions. The conditions of the reaction are given in Table I. It was immediately apparent that the etching became absolutely directional, as shown in FIG. 1B and that no redepositing of brown elemental silicon occurred. In fact, this etching gas cleaned up the brown deposits from the earlier two experiments. This etch gas provided all the features necessary to successfully RIE submicron features in both polysilicon and single crystal silicon; reasonable silicon etch rates, high selectivity and directional etching. It also eliminated the problem of brown silcon redepositing on the inside surfaces of the reactor.

EXAMPLES 5, 6 AND 7

The procedure of Examples 1 and 2 were followed with the exceptions that the etchant gas was a roughly 2:1 blend of 10% $SiF_4$ in He to 12% $Cl_2$ in Ar. The conditions of the reaction are given in Table I. This mixtures provided all the necessary good features found in Examples 3 and 4 with even higher selectivity.

EXAMPLE 8

The procedure of Example 1 was followed with the exception that 12% chlorine and 88% argon was utilized as the etching gas under the conditions of Table I.

The conditions were chosen to reproduce the directional etching achieved in Examples 3, 4, 5, 6 and 7. The results clearly showed that the selectivity of this end member gas is inferior to mixtures of $SiF_4 + Cl_2$ in inert gases.

While the invention has been particularly described with reference to the preferred embodiments thereof, it would be understood by those skilled in the art that the foregoing and other changes in form and detail may be made therein without departing from the scope of the invention.

Having thus described my invention, what I claim as new and desire to secure by Letters Patent is:

1. A method for selective directional and contamination-free reactive ion etching of silicon against insulator mask comprising:
    providing a silicon body having a mask thereon composed of a material which will remain substantially unaffected by a $SiF_4$ and $Cl_2$ plasma;
    subjecting the unmasked regions of said silicon body to an R.F. plasma consisting essentially of X parts $SiF_4$, Y parts $Cl_2$, and Z parts of inert gas wherein $X+Y+Z$ is essentially one hundred, $X+Y$ is less than about 25 parts, and X and Y are respectively greater than zero; and
    continuing the subjective step until the desired etching is completed whereat said silicon body is substantially contamination free.

TABLE I

| Ex. | Etch Gas | $SiO_2$ (rate in A/min.) | N+ Poly (rate in A/min.) | P−<100> (rate in A/min.) | Etch Rate Ratios P−/$SiO_2$ | N + $SiO_2$ | Total Gas Flow (in cc/min.) | Power (Watts) | Pressure (M Torr) |
|---|---|---|---|---|---|---|---|---|---|
| 1 | 10%$SiF_4$90%He | 19 | 296 | 284 | 14.8 | 15.5 | 30.0 | 150 | 100 |
| 2 | 10%$SiF_4$90%He | 38 | 336 | 301 | 8.0 | 8.9 | 34.0 | 150 | 100 |
| 3 | 5.2%$SiF_4$5.8%$Cl_2$ 42%Ar 47%He | 48 | 506 | 431 | 9.0 | 10.6 | 25.0 | 150 | 100 |
| 4 | 5%$SiF_4$6%$Cl_2$ 44%Ar 45%He | 46 | 633 | 518 | 11.2 | 13.7 | 34.0 | 150 | 100 |
| 5 | 6.8%$SiF_4$3.8%Cl 28.6%Ar 60.8%He | 49 | 524 | 463 | 9.5 | 10.7 | 34.0 | 150 | 100 |
| 6 | 6.6%$SiF_4$4.0%Cl 30.0%Ar 59.4%He | 56 | 532 | 453 | 8.1 | 9.5 | 35.7 | 150 | 100 |
| 7 | 6.5%$SiF_4$4.2%Cl 31.0%Ar 58.3%He | 37 | 557 | 447 | 12.1 | 15.0 | 34.0 | 150 | 150 |
| 8 | 12%$Cl_2$ 88%Ar | 99 | 692 | 563 | 5.7 | 7.0 | 25.0 | 100 | 9 |

2. The method of claim 1 wherein said silicon body is monocrystalline silicon.

3. The method of claim 1 wherein said silicon body is a layer of polycrystalline silicon.

4. The method of claim 1 wherein said mask is composed of silicon dioxide.

5. The method of claim 1 wherein X has a magnitude between about 1.5 and 20 parts.

6. The method of claim 5 wherein the said X and Y is between about 2 and 25 parts.

7. The method of claim 1 wherein the inert gas is helium.

8. The method of claim 1 wherein the inert gas is argon.

* * * * *